United States Patent [19]

Hara et al.

[11] Patent Number: 4,749,910
[45] Date of Patent: Jun. 7, 1988

[54] ELECTRON BEAM-EXCITED ION BEAM SOURCE

[75] Inventors: Tamio Hara, Niiza; Manabu Hamagaki, Wako; Yoshinobu Aoyagi, Saitama; Susumu Namba, Tokyo, all of Japan

[73] Assignee: Rikagaku Kenkyusho, Saitama, Japan

[21] Appl. No.: 868,350

[22] Filed: May 28, 1986

[30] Foreign Application Priority Data

May 28, 1985 [JP] Japan .................. 60-115085
Jun. 18, 1985 [JP] Japan .................. 60-132138

[51] Int. Cl.⁴ .................. H01J 7/24; H05B 31/26
[52] U.S. Cl. .................. 315/111.81; 250/423 R; 313/231.31; 313/362.1; 315/111.91; 315/111.31; 315/111.41
[58] Field of Search .................. 315/111.51, 111.61, 315/111.71, 111.81, 111.91, 111.31, 111.41; 313/231.31; 250/423; 363/362.1

[56] References Cited

U.S. PATENT DOCUMENTS 3,270,243  8/1966  Kerst .................. 315/111.61 X
3,315,125  4/1967  Frohlich .................. 315/111.81
4,085,376  4/1978  Abramyan et al. .................. 315/5.38
4,339,691  7/1982  Morimiya et al. .................. 315/111.21
4,388,560  6/1983  Robinson et al. .................. 315/111.81
4,422,013 12/1983  Turchi et al. .................. 315/111.61
4,574,179  3/1986  Masuzawa et al. .................. 315/111.81

OTHER PUBLICATIONS

"Research Report" of the Institute of Plasma Physics, Nagoya University, Joshin Uramoto, May 1979.

*Primary Examiner*—Saxfield Chatmon
*Attorney, Agent, or Firm*—Brumbaugh, Graves, Donohue & Raymond

[57] ABSTRACT

An electron beam-excited ion beam source having a plasma region, an accelerating cathode, an electron beam accelerating region, an accelerating anode, an ion producing region and a target cathode in this order, and further comprising means for applying a negative electric potential to the target cathode as against the accelerating cathode and an ion extracting electrode for extracting positive ions or negative ions produced in the ion producing region whereby a high current ion beam can be obtained in a low input power.

4 Claims, 9 Drawing Sheets

ELECTRON BEAM-EXCITED ION BEAM SOURCE

BACKGROUND OF THE INVENTION

This invention relates to an electron beam-excited ion beam source in which ions are produced by electron beam irradiation.

Ion beam sources have been used to etch semiconductor substrates. In order to efficiently etch the semiconductor substrates without causing large damage to the substrates, a high current and low energy ion beam is needed. However, the high current and low energy ion beam could not be obtained by conventional sources far. In the known ion beam sources, the ion beam currents low energy are below 10 mA/cm$^2$. One of the known ion beam sources is disclosed by J. Uramoto in Research Report of Institute of Plasma Physics, Nagoya University, Nagoya, Japan, IPPJ-395 (1979).

SUMMARY OF THE INVENTION

An object of the invention is to provide an ion beam source which can produce a high current and low energy ion beam.

Another object of the invention is to provide an ion beam should which can produce an ion beam with high efficiency.

The above objects are attained by an electron beamexcited ion beam source according to this invention. This electron beam-excited ion beam source has a plasma region, an accelerating cathode, an electron beam accelerating region, an accelerating anode, an ion producing region and a target cathode arranged in order, and further comprises means for applying a negative electric potential to the target cathode as against the accelerating cathode and an ion extracting electrode for extracting positive ions or negative ions produced in the ion producing region.

In this ion beam source, electrons in the plasma region are entered into the ion producing region by the accelerating anode. The entered electrons excite and ionize atoms of an inert gas (or a metal vapor) charged in the ion generating region. A part of the produced ions flow to the plasma region and prevent generation of negative space charge near an outlet of the accelerating cathode. Therefore, an electron beam of high current proportional to a plasma density of the plasma region enter into the ion producing region. In the ion producing region, ions, the number of which is proportional to the current value of the introduced electron beam, are generated.

In the ion beam source according to this invention, as shown in FIG. 2, a potential well is formed by the accelerating cathode, the accelerating anode and the target cathode. The electrons entered from the plasma region go and return in the potential well and plasma is effectively produced. Ions in the plasma are extracted by the ion extracting electrode and emitted from the ion producing region. Energy (velocity) of the ions are determined by the potential difference between the ion extracting electrode and the accelerating anode. In the case where a multipole magnetic field, a mirror magnetic field or an electric potential well for preventing lateral diffusion of charged particles is provided at the ion producing region, plasma is more effectively produced.

The ion beam source according to this invention can be used as that for ion implant apparatus. When the inside of this ion beam source is filled with an inert gas such as Argon or a reactive gas such as CF$_4$, this ion beam source can be used as an ion beam source for etching. Additionally, if this ion beam source is filled with a gas for producing films such as SiF$_4$, this ion beam source can be used as that for producing films. Moreover, this ion beam source can be used to effectively heat plasma in nuclear fusion because the ratio of ion beam current to input power is large.

According to this invention, a high current and low energy ion beam can be obtained, in other words, the ratio of ion beam current to input power is large. Therefore, it becomes possible to effectively process workpieces such as semiconductor substrates without causing defects in crystal. In the field of nuclear fusion, it becomes possible to heat plasma with high efficiency.

BRIEF DESCRIPTION OF THE DRAWINGS

The foregoing and other objects of this invention will be seen by reference to the description, taken in connection with the drawings in which.

DESCRIPTION OF THE PREFERRED EMBODIMENTS

Figure 1:
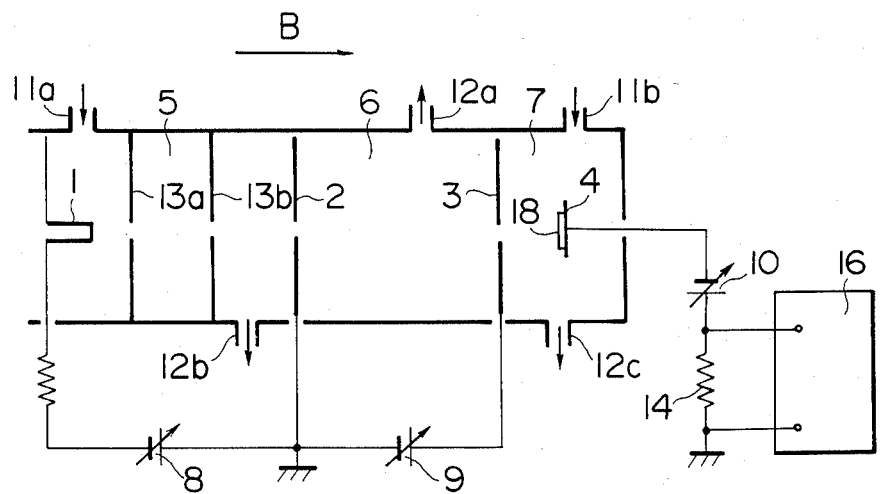
FIG. 1 is a schematic of the first embodiment according to this invention.

FIG. 1 is a schematic of the first embodiment according to this invention. A discharge cathode 1, an accelerating cathode 2 also operating as a discharge anode, an accelerating anode 3, and a workpiece disposed conductive portion 4 operating as a target cathode and an ion extracting cathode are disposed in this order. The first space between the cathode 1 and the accelerating cathode 2 is a plasma region 5 filled with plasma. The second space between the accelerating cathode 2 and the accelerating anode 3 is an electron accelerating region 6 for accelerating the electrons which are extracted from the plasma region 5. And the third space between the acceleration anode 3 and the workpiece disposed portion 4 is an ion producing region 7. A power source 8 applies a voltage between the discharge cathode 1 and the acceleration cathode 2 and then discharge for producing plasma is caused. An accelerating voltage source 9 produces a potential difference between the accelerating cathode 2 and the accelerating anode 3. The electrons in the plasma region 5 and ions in the ion producing region 7 are accelerated to the accelerating anode 3 and the accelerating cathode 4 respectively by the potential difference. The accelerating cathode 2 is directly grounded. The workpiece disposed portion 4 is grounded through a voltage source for controlling ion energy 10 so that a voltage between the substance disposed portion 4 and the accelerating anode 3 is controlled. The inert gas, usually used, such as Argon enters into the ion beam source from inlets 11a, 11b and exits from outlets 12a, 12b, 12c. In this embodiment, a magnetic field is applied along the propagating direction of ions and electrons, so that lateral expansion of electron beam and ion beam is prohibited. Partitions 13a, 13b which are disposed at the plasma region 5 is to make a pressure difference for the gas charged in the plasma region.

The ion beam source is constructed above operates as follows. Plasma is produced in the plasma region 5 by means of the discharge which is caused between the cathode 1 and the accelerating cathode 2. The electrons, which make up the plasma, are attracted by the accelerating anode 3, enter into the ion producing region 7, and produce ions. A part of these ions is attracted by the accelerating cathode 2 and neutralizes the negative space charge which is produced near an aperture of the accelerating cathode 2. Therefore, an electron beam having a current proportional to the plasma density in the plasma region grows into the ion producing region 7. In the ion producing region 7, ions, the number of which is proportional to the current value or the number of the entered electrons, are produced. A workpiece 18 on the workpiece disposed portion 4 is irradiated with the produced ions after their energy is controlled by the potential of the workpiece disposed portion 4.

Figure 2:
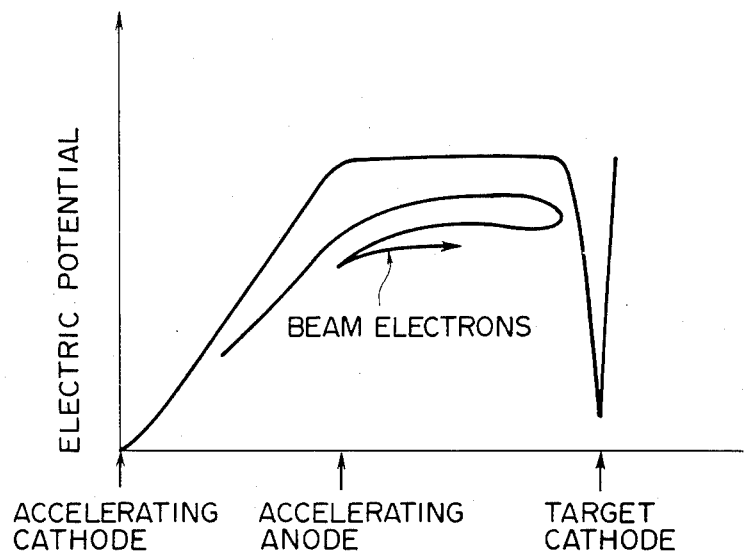
FIG. 2 is a drawing for illustrating the operation of this invention.
Figure 3:
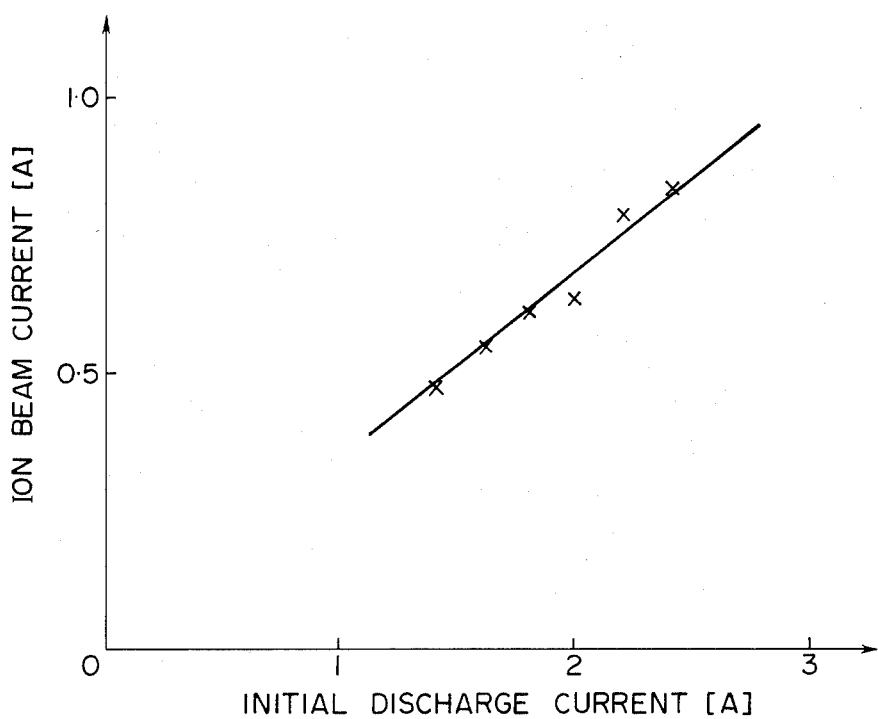
FIG. 3 is a graph showing a relation between an ion beam current and an initial discharge current obtained in the first embodiment.

FIG. 3 shows a relation between an ion beam current and an initial discharge current (almost equal to an electron beam current) in the above embodiment having the condition that the gas charged in the ion beam source is Argon gas, the voltage between the accelerating cathode 2 and the accelerating anode 3 is 110 V, the voltage between the substance disposed portion 4 and the ground is $-34$ V, the pressure at the plasma region 5 is 0.7 Torr, the pressure at the electron accelerating region 6 is $1.1 \times 10^{-4}$ Torr, the pressure at the ion producing region 7 is $2.0 \times 10^{-3}$ Torr, and the distance between the accelerating anode 3 and the workpiece disposed portion 4 is 10 cm. From FIG. 2, it can be found that a large ion beam current, which is larger than that of conventional ion beam source by a factor of 100, was obtained. The ion beam current was measured by reading the voltmeter 16 measuring a voltage across a resistor 14.

An alternate (high-frequency) voltage source can be used as the voltage source for controlling ion energy 10. The voltage of the workpiece 18 can be changed by controlling the voltage of the alternate voltage source.

Figure 4:
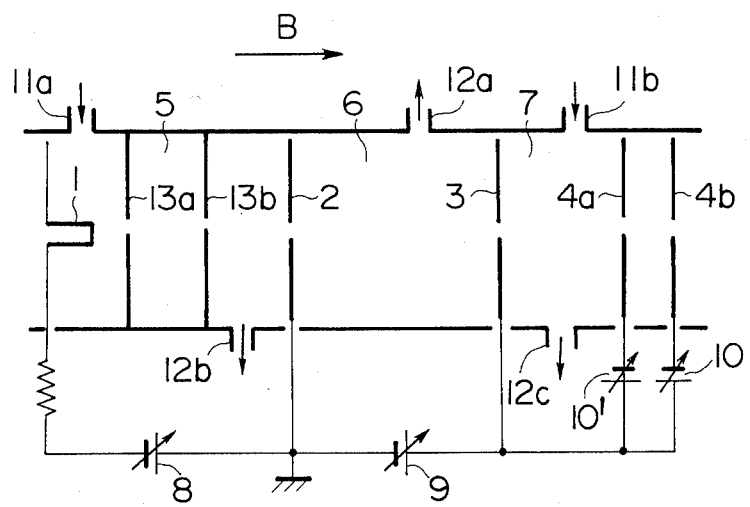
FIG. 4 is a schematic of the second embodiment according to this invention.

FIG. 4 is a schematic of the second embodiment according to this invention. Compared with the first embodiment, a target cathode 4a and an ion extracting anode 4b are disposed instead of the workpiece disposed conductive portion 4. The first space between the accelerating anode 3 and the arget cathode 4a corresponds to the ion producing region 7. The ion accelerating electrode 4b connects to the accelerating anode 3 through the variable voltage source for controlling ion energy 10. A voltage between the target cathode 4a and the accelerating anode 3 can be controlled by a voltage source 10'. The ions produced in the ion producing region 7 are extracted by the ion extracting electrode 4b and emitted from the ion beam source.

Figure 5:
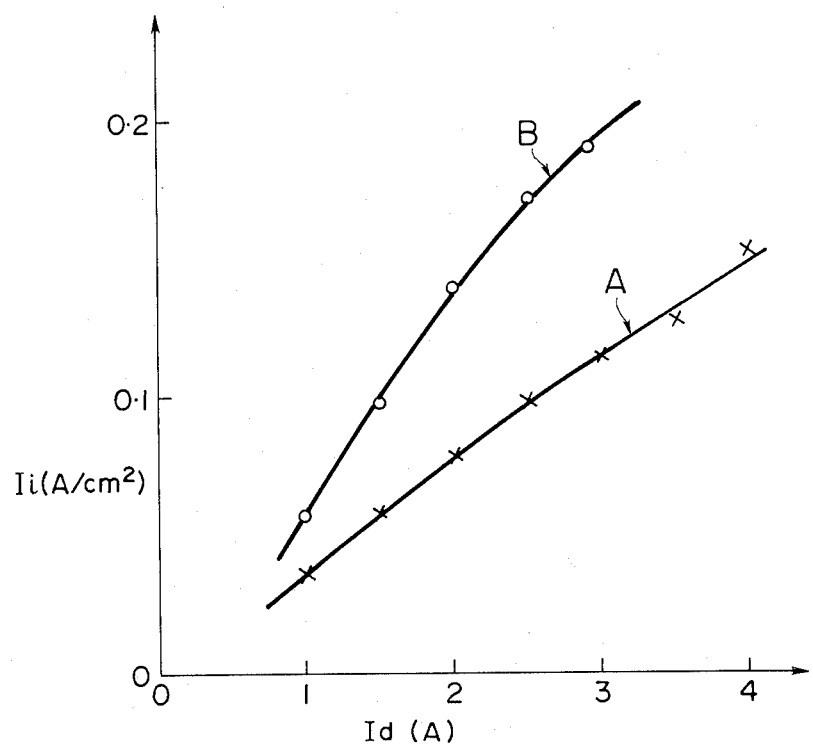
FIG. 5 is a graph showing a relation between an ion beam current and an initial discharge current obtained in the second embodiment.
Figure 6:
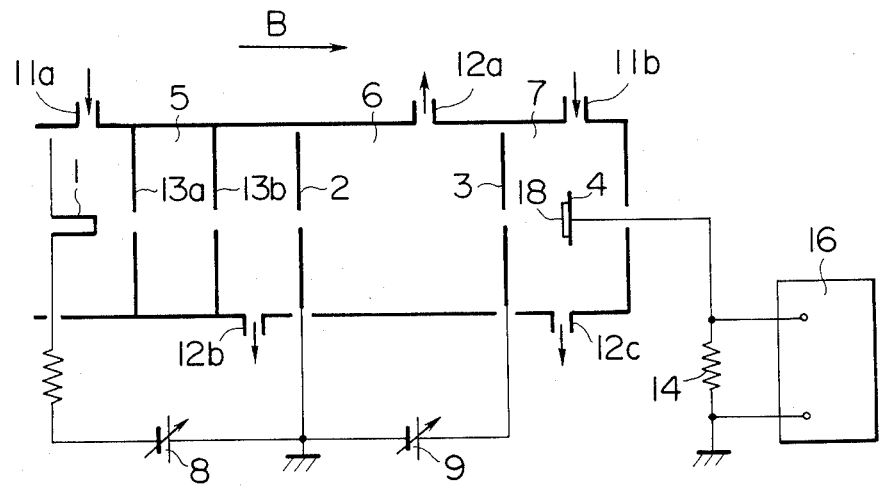
FIGS. 6 to 9 are schematics of the third, the fourth, the fifth and the sixth embodiments, respectively.
Figure 7:
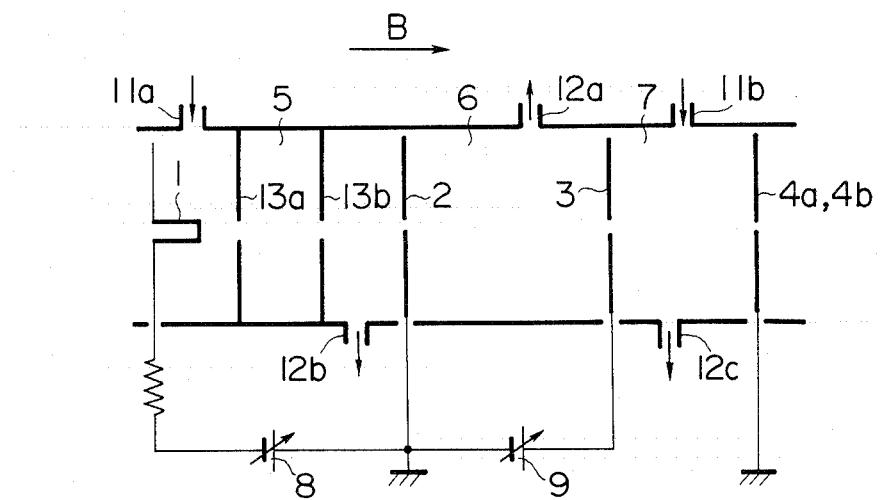
Figure 8:
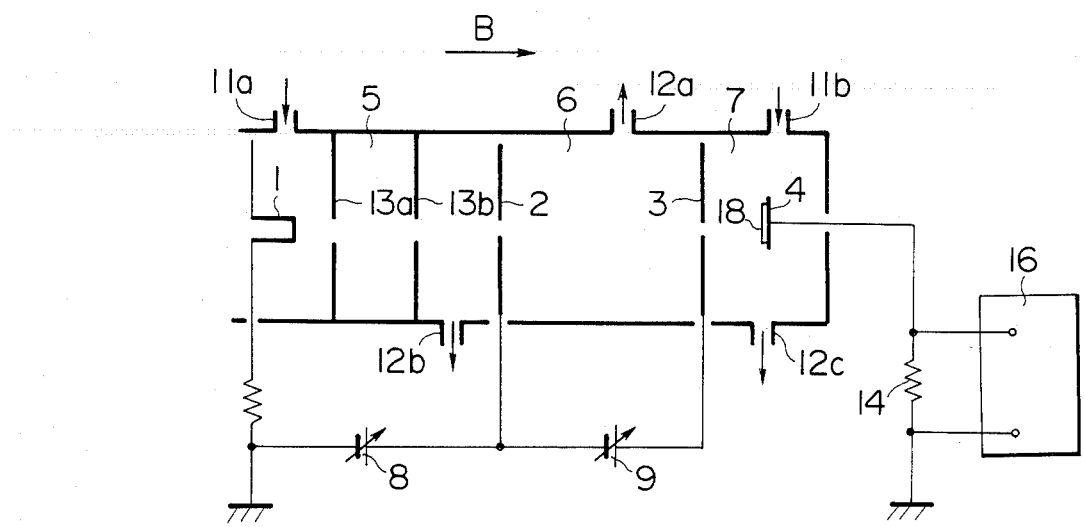
Figure 9:
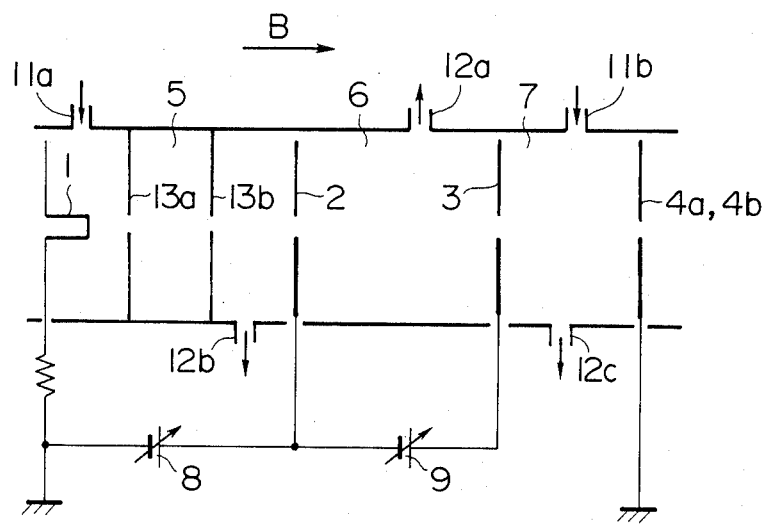

FIG. 5 shows a relation between the extracted ion beam current Ii and the discharge current Id (almost equal to an electron beam current) in the above embodiment having the condition that the gas charged in the ion beam source is Argon gas, the voltage between the accelerating cathode 2 and the accelerating anode 3 is 100 V, the voltage between the ion extracting electrode 4b and the accelerating anode 3 is $-400$ V, the pressure at the plasma region 5 is 0.8 Torr, the pressure at the electron accelerating region 6 is $0.8 \times 10^{-4}$ Torr, the pressure at the ion producing is $2.0 \times 10^{-3}$ Torr, and the diameter of an aperture of the ion producing region 7 is 1mm. The curve A corresponds to the case that the potential of the target cathode 4a is the same as that of the accelerating anode 3, the curve B corresponds to the case that the potential of the target cathode 4a to the accelerating anode 3 is $-100$ V. From FIG. 5, it is clear that according to this invention high current ion beam can be obtained. If the voltage between the ion extracting electrode 4b and the accelerating anode 3 is not so large, the ion extracting electrode 4b and the target cathode 4a can be combined.

FIGS. 6 to 9 are schematics of the third, the fourth, the fifth and the sixth embodiment, respectively. The third and the fifth embodiments are obtained by modifying the first embodiment shown in FIG. 1, and the fourth and the sixth embodiments are obtained by modifying the second embodiment shown in FIG. 4. In these embodiments, the voltage between the workpiece disposed portion 4 or the ion extracting electrode 4b and the accelerating anode 3 can be changed by not controlling the voltage between the workpiece disposed portion 4 or the ion extracting electrode 4b and the accelerating anode 3 but controlling the voltage of the accelerating voltage source 9 which is disposed between the accelerating cathode 2 and the accelerating anode 3. In each embodiment shown in FIGS. 6 to 9, the voltage source for controlling ion energy 10 is not adopted, and the workpiece disposed portion 4 or the ion extracting electrode 4b is directly grounded. The ion energy can be controlled by changing the voltage of the accelerating voltage source 9. In either embodiments shown in FIGS. 8 and 9, the cathode 1 is grounded, so that the voltage between the workpiece disposed portion 4 or the ion extracting electrode 4b and the accerlating anode 3 can also be changed by varying the voltage of the discharge power source 8.

Figure 10A:
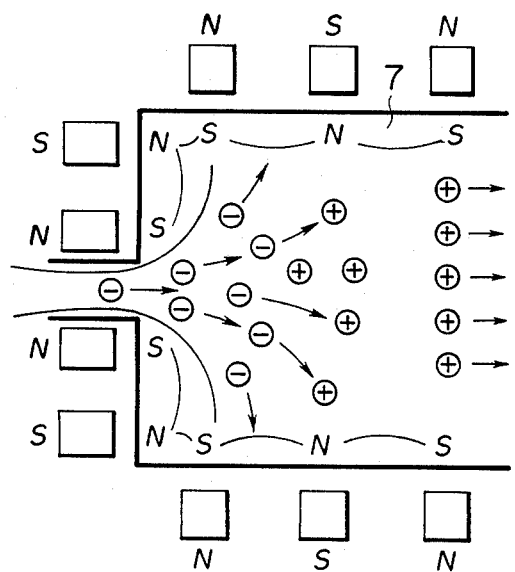
FIGS. 10a and 10b are a longitudinal section and a transverse section respectively which show a multiple magnetic field formed at the ion producing region.
Figure 10B:
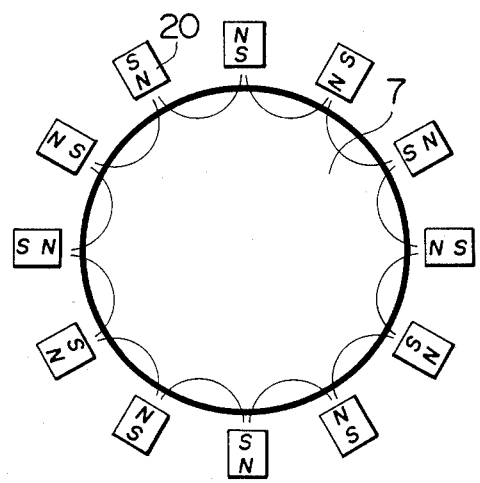

Even if a uniform magnetic field is used as the magnetic field for guiding the electron beam as in the embodiments shown in FIGS. 1 to 6, it was recognized that an ion beam of 15 mm in diameter can be obtained. When permanent magnets 20 are disposed on a periphery of the ion producing region 7 so that a multipole magnetic field is formed as shown in FIGS. 10a and 10b, the diameter of the ion beam is further expanded.

Figure 11:
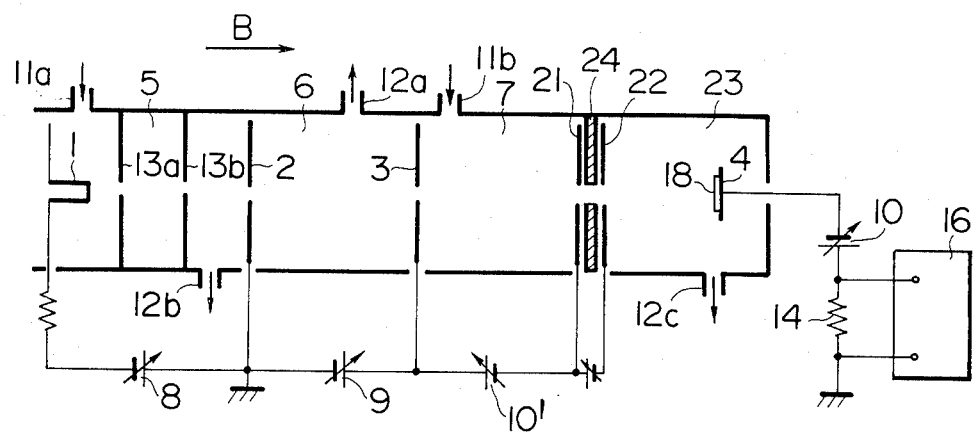
FIG. 11 is a schematic of the seventh embodiment which is obtained by modifying the first embodiment.

In the present invention many modified embodiments can be obtained. For example, the accelerating anode 3 can be divided into two anodes and the ion producing region 7 can be divided into two ion producing regions. As shown in FIG. 11, the ion generating region 7 and a working chamber 23 can be divided by two ion extracting electrodes 21, 22 having an insulator 24 therebetween so that the inside of the working chamber 23 becomes high vacuum. The ions in the ion producing region 7 are entered into the working chamber 23 by attraction of the workpiece disposed portion 4. An electron beam-excited plasma region can be provided between the ion producing region and the target cathode so that the workpiece is irradiated with ions produced at the electron beam-excited plasma region.

Figure 12:
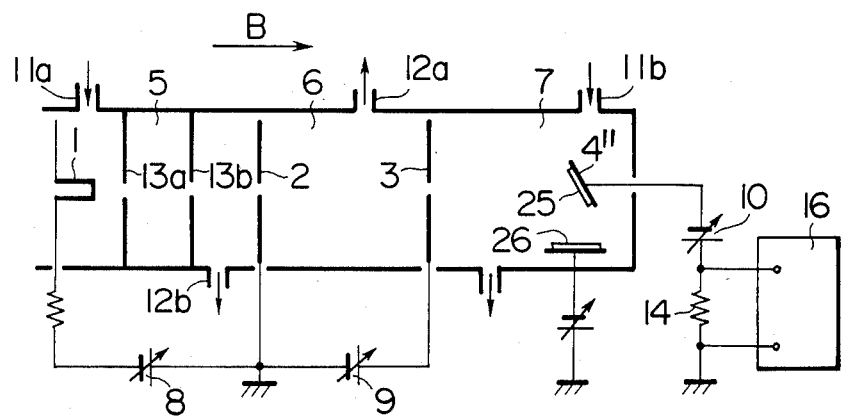
FIGS. 12 and 13 are schematics of the eighth and the ninth embodiments which are used as sputter apparatus.

FIG. 12 shows a schematic of the eighth embodiment which is obtained by modifying the first embodiment. This embodiment is used as a sputter apparatus. The ions produced at the ion producing region 7 collide with a target 25 on the workpiece disposed conductive portion 4. Target material which is dispersed by the ion collision deposits on a substrate 26. If an electric potential is applied to the substrate as shown in FIG. 12, atoms of the target material which are ionized by the electron beam iradiation, are attracted by the substrate 26.

Figure 13:
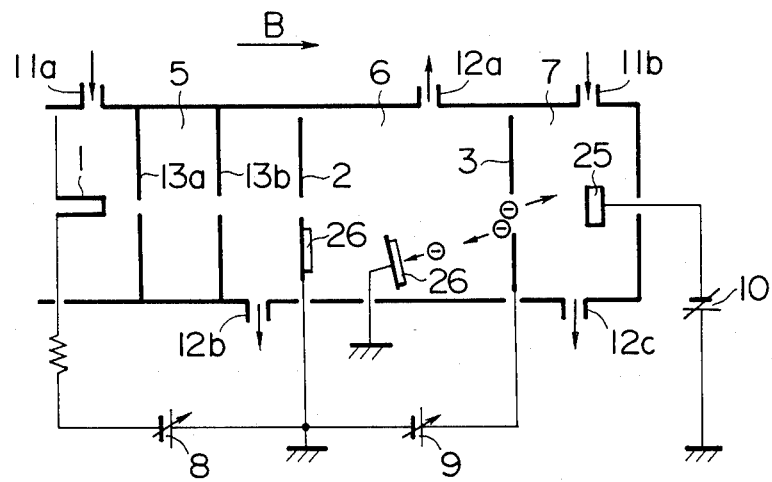

FIG. 13 shows a schematic of ninth embodiment which is also used as a sputter apparatus. In this embodiment, the target 25 itself operates as the target cathode and the ion extracting electrode. The target material is gasified by the irradiation of the ion beam, the gasified target material is irradiated with the electron beam and ions of the target material are produced. The ions are extracted by the accelerating cathode 2. The ions on the way to the plasma region 5 are encountered with the substrate 26 and a film is produced thereon. In the embodiment, it is preferable to make the aperture of the accelerating anode 3 large and to form a magnetic field near the target 25 so as to concentrate the ion beam on the target.

The table for supporting the substrate 26 may be the accelerating cathode 2 itself.

Figure 14:
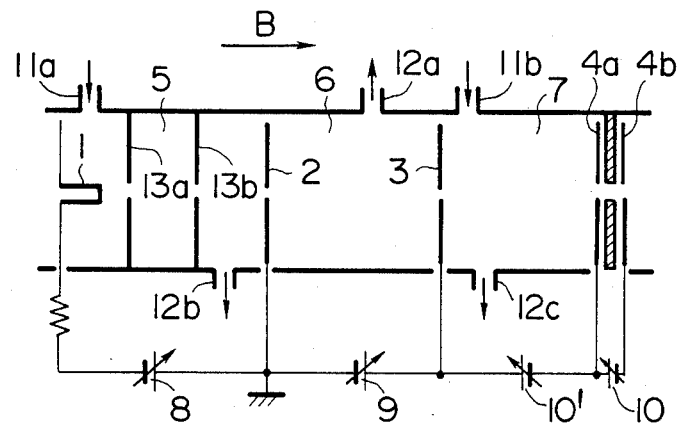
FIG. 14 is a schematic of the tenth embodiment which is obtained by modifying the second embodiment.

FIG. 14 is a schematic of the tenth embodiment which is obtained by modifying the second embodiment. In this embodiment, the voltage of the ion extracting electrode 4b to the target cathode 4a is controlled by the voltage source 10.

If an extra electrode is disposed between the target cathode 4a and the ion extracting electrode 4b, a large extracting voltage can be applied to the extra electrode. In this case, since the energy of the ion beam is also controlled by the ion extracting electrode, a higher current and low energy ion beam can be obtained.

Figure 15:
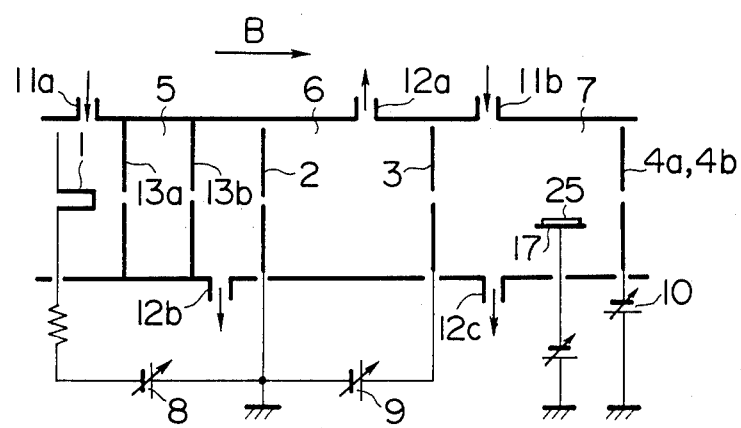
FIG. 15 is a schematic of the eleventh embodiment which is a sputtering type ion source.

FIG. 15 shows a schematic of the eleventh embodiment which is a sputter type ion source. The ions produced at the ion producing region 7 collide with the target 25 on the workpiece disposed portion 17. The target material is dispersed by the ion collision, atoms of target material are ionized by the irradiation of electron beam, and the ionized atoms of target material are extracted to the outside of the ion source by the electrode 4a, 4b.

Figure 16:
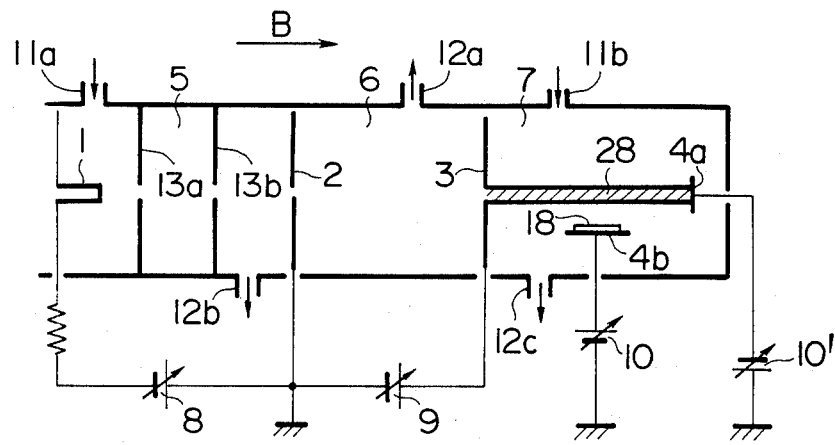
FIGS. 16 and 17 are schematics of the twelfth and the thirteenth embodiments in which negative ions can be extracted.
Figure 17:
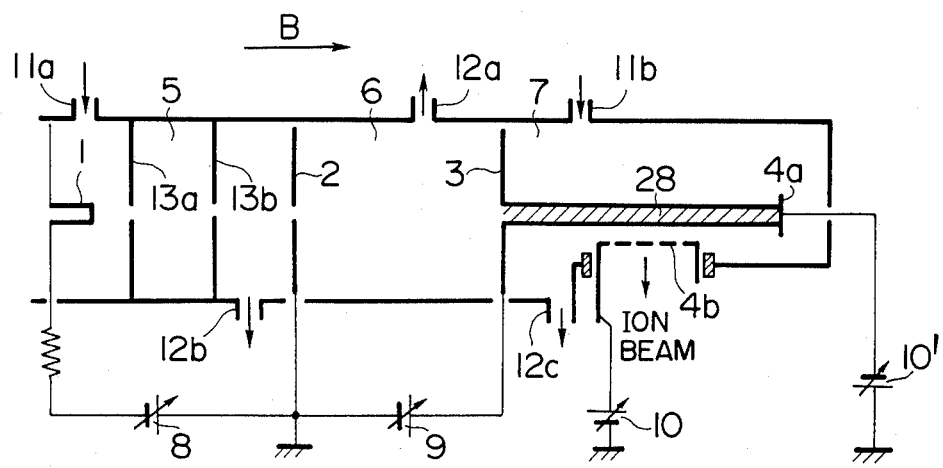

FIGS. 16 and 17 are schematics of the twelfth and the thirteenth embodiments in which negative ions can be extracted. In the twelfth embodiment, the ion extracting electrode 4b operates as the workpiece disposed portion. Larmor radius of ion is largely different from that of electron. In the case that an external magnetic field is applied, there are only ions at space away from the Larmor radius of electron in the direction perpendicular to that of the magnetic field. These embodiments are based on the fact the ion extracting electrode 4b is disposed away from an electron passage 28. When the ion extracting electrode 4b is in a negative potential as against a plasma potential (almost equal to an electric potential of the accelerating anode) positive ions are extracted. On the other hand, when the ion extracting electrode 4b has a positive electric potential as against the plasma potential, negative ions are extracted.

In each embodiment described as above, it is effective to dispose an electrode for regulating a plasma potential between the discharge cathode and the accelerating cathode 2 as disclosed in a specification of Japanese Patent Application No. 59(1984)-276738.

As this invention may be embodied in several forms without departing from the spirit of essential characteristics thereof, the above embodiments are therefore illustrative and not restrictive, since the scope of the invention is defined by the appended claims rather than by the description proceeding them, and all changes that fall within meets and bounds of the claims, or equivalence of such meets and bounds are therefore intended to be embraced by the claims.

What we claim is:

1. An electron-beam excited ion beam source comprising:

a discharge electrode;

an accelerating cathode disposed opposite said discharge electrode;

a plasma region defined between said discharge electrode and said accelerating cathode for producing a plasma therein from an introduced gas by means of a discharge between said discharge electrode and said accelerating cathode;

an accelerating anode disposed opposite said accelerating cathode on a side away from said discharge electrode for accelerating electrons of said plasma produced in said plasma region and having an aperture therein;

an electron-beam accelerating region defined between said accelerating cathode and said accelerating anode for allowing said accelerated electrons to pass into an ion producing region through said aperture;

a target cathode disposed opposite said accelerating anode on a side away from said accelerating cathode;

an ion producing region defined between said accelerating anode and said target cathode for producing ions therein from an introduced gas by said accelerated electrons, a portion of said ions being attracted by said accelerating cathode and neutralizing a negative space charge produced near said aperture such that an electron-beam which has a current proportional to the density of the plasma region grows into the ion producing region.

an ion extracting electrode for extracting ions produced in said ion producing region; and means for regulating the potential difference between said ion extracting electrode and said acceleration anode to control the energy of said extracted ions.

2. The electron-beam excited ion beam source in accordance with claim 1 further comprising a magnetic field applied along the acceleration direction of said electrons and said ions for prohibiting lateral expansion of the electron-beam and ion beam.

3. The electron-beam excited ion beam source in accordance with claims 1 or 2 wherein said target cathode and said ion extracting electrode are formed integrally with each other.

4. The electron-beam excited ion beam source in accordance with claim 1 or 2 wherein said ion extracting electrode is a workpiece disposed conductive portion.

* * * * *